(12) United States Patent
Gorbachov

(10) Patent No.: US 8,374,557 B2
(45) Date of Patent: Feb. 12, 2013

(54) RADIO FREQUENCY FRONT END CIRCUIT WITH ANTENNA DIVERSITY FOR MULTIPATH MITIGATION

(75) Inventor: Oleksandr Gorbachov, Irvine, CA (US)

(73) Assignee: RFAXIS, Inc., Irvine, CA (US)

( * ) Notice: Subject to any disclaimer, the term of this patent is extended or adjusted under 35 U.S.C. 154(b) by 433 days.

(21) Appl. No.: 12/830,203

(22) Filed: Jul. 2, 2010

(65) Prior Publication Data
US 2011/0003563 A1 Jan. 6, 2011

Related U.S. Application Data

(60) Provisional application No. 61/223,164, filed on Jul. 6, 2009.

(51) Int. Cl.
*H04B 1/38* (2006.01)
(52) U.S. Cl. ........... 455/73; 455/83; 455/86; 455/67.11; 455/277.1; 455/78; 455/552.1; 455/62; 342/368; 342/374; 333/101; 333/103
(58) Field of Classification Search ........... 455/73, 455/83, 86, 67.11, 277.1, 78, 552.1, 62
See application file for complete search history.

(56) References Cited

U.S. PATENT DOCUMENTS

| | | | |
|---|---|---|---|
| 6,154,664 A | 11/2000 | Chorey et al. | |
| 6,313,699 B1 | 11/2001 | Nishijima et al. | |
| 6,356,536 B1 * | 3/2002 | Repke | 370/282 |
| 6,728,517 B2 * | 4/2004 | Sugar et al. | 455/73 |
| 7,373,171 B2 | 5/2008 | Nakai | |
| 7,592,968 B2 | 9/2009 | Modro | |
| 7,636,554 B2 * | 12/2009 | Sugar et al. | 455/73 |
| 7,885,613 B2 * | 2/2011 | Kemmochi et al. | 455/78 |
| 8,019,289 B2 * | 9/2011 | Gorbachov | 455/83 |
| 8,036,148 B2 * | 10/2011 | Fukamachi et al. | 370/282 |
| 8,140,025 B2 * | 3/2012 | Gorbachov | 455/73 |
| 8,175,541 B2 * | 5/2012 | Gorbachov | 455/73 |
| 8,265,567 B2 * | 9/2012 | Gorbachov | 455/73 |
| 2005/0009484 A1 | 1/2005 | Imai et al. | |
| 2005/0206456 A1 | 9/2005 | Suzuki et al. | |
| 2007/0015472 A1 | 1/2007 | Murtojarvi et al. | |
| 2007/0152891 A1 | 7/2007 | Fabrega-Sanchez et al. | |
| 2007/0161358 A1 | 7/2007 | Bogdan | |
| 2008/0220826 A1 | 9/2008 | Dagher et al. | |
| 2008/0238804 A1 | 10/2008 | Suh et al. | |
| 2009/0102728 A1 | 4/2009 | Gamand | |
| 2009/0243951 A1 | 10/2009 | Desclos et al. | |

OTHER PUBLICATIONS

International Search Report; PCT/US2010/033593; Jul. 7, 2010; one page.
Kerby, Kiersten C.; Ground Plane Slot Structures for Isolation of Cosited Microstrip Antennas; Dissertation; University of Illinois at Urbana-Champaign; 2009, 84 pages.

\* cited by examiner

*Primary Examiner* — Marceau Milord
(74) *Attorney, Agent, or Firm* — Stetina Brunda Garred & Brucker

(57) ABSTRACT

A front end circuit for selectively coupling a first antenna and a second antenna to a transmit chain and a receive chain of a radio frequency (RF) transceiver is disclosed. There is a first power amplifier having an input connectible to the transmit chain of the RF transceiver, a first low noise amplifier having an output connectible to the receive chain of the RF transceiver, and a second low noise amplifier with an input connectible to the second antenna, as well as an output connectible to the receive chain of the RF transceiver. A first matching and switch network is connected to the first antenna, the output of the first power amplifier, and the input of the first low noise amplifier. Transmit signals from the first power amplifier and receive signals from the first antenna are selectively passed to the first antenna and the first low noise amplifier.

31 Claims, 8 Drawing Sheets

RADIO FREQUENCY FRONT END CIRCUIT WITH ANTENNA DIVERSITY FOR MULTIPATH MITIGATION

CROSS-REFERENCE TO RELATED APPLICATIONS

This application relates to and claims the benefit of U.S. Provisional Application No. 61/223,164, filed Jul. 6, 2009 and entitled "RF FRONT-END TRANSMIT-RECEIVE INTEGRATED CIRCUITS (IC) WITH ANTENNA DIVERSITY," which is wholly incorporated by reference herein.

STATEMENT RE: FEDERALLY SPONSORED RESEARCH/DEVELOPMENT

Not Applicable

BACKGROUND

1. Technical Field

The present invention relates generally to radio frequency (RF) signal circuitry, and more particularly, to RF front end circuits with antenna diversity for multipath mitigation.

2. Related Art

Wireless communications systems find application in numerous contexts involving information transfer over long and short distances alike, and there exists a wide range of modalities suited to meet the particular needs of each. These systems include cellular telephones and two-way radios for distant voice communications, as well as shorter-range data networks for computer systems, among many others. In general, wireless communications involve a radio frequency (RF) carrier signal that is variously modulated to represent data, and the modulation, transmission, receipt, and demodulation of the signal conform to a set of standards for coordination of the same. For wireless data networks, such standards include Wireless LAN (IEEE 802.11x), Bluetooth (IEEE 802.15.1), and ZigBee (IEEE 802.15.4).

In general, these communications modalities transmit and receive signals on a single channel or frequency. In order to share the single channel, the transmit and receive signals are time-domain duplexed. That is, for a predetermined period of time, one transmitter of a first communications node generates a burst signal, and for another predetermined period, the other transmitter at a counterpart communications node generates another burst signal to be detected by the receiver of the first communications node. It is understood that the transmit signals and the receive signals do not overlap in the time domain. Where the receiver detects errors in the burst signal via checksums and other well-known error detection/correction techniques, the other transmitter may be directed to retry. Errors may be caused in part by increased noise from the surrounding environment, obstacles and so forth. If there are a substantial number of retry attempts, data throughput is decreased, or the communications link may cease altogether.

Signal reception problems in WLAN and other systems are typically attributable to multi-path propagation phenomena, where a single signal reaches the antenna via two or more different paths because of obstacles between the transmitter and the counterpart receiver. At the RF signal level, destructive interference and phase shifts may occur. Specifically, the signals may be of differing phases and when combined at the receiver, may be weakened to the point of being unrecoverable by the receiver, thus forcing additional transmission retry attempts.

One approach to solve this problem employs two antennas for the same communications node that are physically separated from each other. The probability that the RF signals will reach both of the antennas with different amplitudes and phases and have a destructive effect on each other upon receipt is known to be miniscule, and the dual antenna configuration is understood to exploit this low probability. In most implementations, there are two receive chains, each connected to a separate antenna. The receiver may further process the stronger of the two detected signals. This configuration is known as receive antenna diversity. Alternatively, or in conjunction with receive antenna diversity, two spatially separated antennas may be connected to separate transmit chains of the same communications node in a configuration known as transmit antenna diversity, and is also known to mitigate multipath phenomena, even with a counterpart single antenna receiver.

Conventional implementations of receive antenna diversity utilize a dual pole, dual throw (DPDT) RF switch with a first pair of terminals connected to the two antennas and a second pair of terminals connected to the receive chain and the transmit chain. Thus, the switch connects only one of the antennas to the receive chain at a time, with the receiver selecting the antenna with the higher received power level. It is possible to implement transmit antenna diversity in this configuration as well, as the DPDT switch connects only one of the antennas to the transmit chain at a time. A special algorithm may be used to select the receive antenna with the higher power level that involves switching from one antenna to another between transmission bursts. However, during this initial estimation period, data throughput of the communications link may be lower in comparison to the steady state condition when the antenna with better reception has been determined. Besides utilizing DPDT switches, single pole, dual throw switches may be substituted, or any other suitable switch configurations.

Transceivers for WLAN, Bluetooth, Zigbee, and the like typically do not generate sufficient power or have sufficient sensitivity necessary for reliable communications. Additional signal conditioning is therefore necessary, and so the receive chain includes a low noise amplifier and the transmit chain includes a power amplifier. This circuitry between the antenna and the transceiver is also referred to as a front end module or circuit, and for those with antenna diversity features, the aforementioned DPDT switch is included therein along with the low noise amplifier and the power amplifier. The DPDT switch is on the antenna side, while the low noise amplifier and the power amplifier is on the transceiver side.

In the transmit mode, the power amplifier is turned on, while the low noise amplifier is turned off, with the transmit signal applied to the power amplifier. The DPDT switch is set so that the power amplifier is connected to the first of the pair of antennas or the second of the pair of antennas. The transmit signal amplified by the power amplifier is thus selectively applied to the first or the second one of the pair of antennas.

In the receive mode, the low noise amplifier is turned on, while the power amplifier is turned off. The DPDT switch is set so that the low noise amplifier is connected to the first of the pair of antennas or the second of the pair of antennas, such that the signal received on either one of the pair of antennas is amplified by the low noise amplifier for further processing by the RF transceiver and the baseband circuitry.

There are a number of deficiencies associated with such conventional front end modules with antenna diversity, however. One known problem is the insertion loss between either of the pair of antennas and the low noise amplifier attributable to the DPDT switch. Consequently, the noise figure of the receive chain is elevated. Furthermore, a modular fabrication technique is necessary to separate the power amplifier and the low noise amplifier from the DPDT switch. In particular, the power amplifier circuitry and the low noise amplifier circuitry is fabricated on one semiconductor die utilizing a Gallium Arsenide (GaAs) or Silicon Germanium (SiGe) substrate with hetero-junction bipolar transistors (HBT). The DPDT switch is fabricated on another semiconductor die utilizing a GaAs substrate with high electron mobility transistors (HEMT) or metal semiconductor field effect transistors (MESFET). It is possible for both HBT and HEMT transistors to be fabricated on a single die with a composite GaAs substrate, but at a greater cost. The DPDT switch therefore represents a significant constraint on the design and configuration of the front end circuit.

Accordingly, there is a need in the art for an improved RF front end circuit with antenna diversity for multipath mitigation.

BRIEF SUMMARY

In accordance with one embodiment of the present disclosure, a front end circuit for selectively coupling a first antenna and a second antenna to a transmit chain and a receive chain of a radio frequency (RF) transceiver is contemplated. The front end circuit may include a first power amplifier having an input connectible to the transmit chain of the RF transceiver. The first power amplifier may also have an output. The front end circuit may further include a first low noise amplifier having an output connectible to the receive chain of the RF transceiver. The first low noise amplifier may also have an input. There may be a second low noise amplifier with an input connectible to the second antenna, and an output connectible to the receive chain of the RF transceiver. The front end circuit may include a first matching and switch network connected to the first antenna, the output of the first power amplifier, and the input of the first low noise amplifier. Transmit signals from the first power amplifier and receive signals from the first antenna may be selectively passed to the respective one of the first antenna and the first low noise amplifier thereby based upon an exclusive activation of the first power amplifier and the first low noise amplifier.

Another embodiment contemplates an RF front end circuit for coupling a first antenna and a second antenna to a transceiver with receive channel and a transmit channel. The front end circuit may include a plurality of selectively activatable circuit elements including a power amplifier and low noise amplifiers. The circuit elements together may have a transmit mode in which signals from the transmit channel are amplified by the power amplifier for the transmission by the first antenna. They may also have a first receive mode in which signals from the first antenna are amplified by a one of the low noise amplifiers for passing to the receive channel. The circuit elements together may also have a second receive mode in which signals from the second antenna are amplified by a different one of the low noise amplifiers for passing to the receive channel. They may also have a third receive mode in which signals from the first and second antenna are amplified simultaneously by the respective low noise amplifiers for passing to the receive channel.

The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The detailed description set forth below in connection with the appended drawings is intended as a description of certain embodiments of the present disclosure, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present disclosure. It is further understood that the use of relational terms such as first and second and the like are used solely to distinguish one entity from another without necessarily requiring or implying any actual such relationship or order between such entities.

Figure 1:
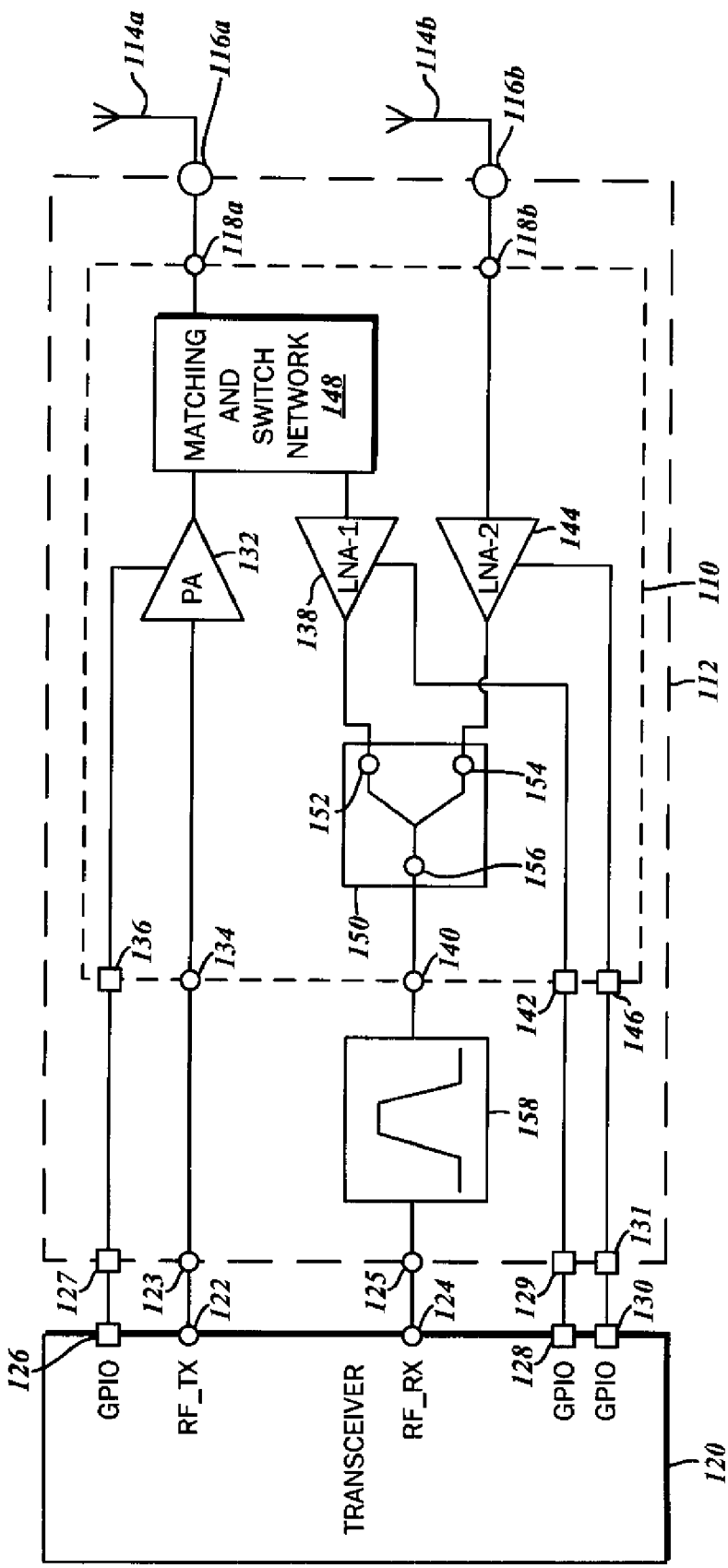
FIG. 1 is a block diagram of one embodiment of an RF front end circuit connected to a transceiver and a pair of antennas for receive diversity.

The block diagram of FIG. 1 illustrates a front end circuit 110 in accordance with one embodiment of the present disclosure. The front end circuit 110 is incorporated into a front end module 112 that is connected to a first antenna 114a and a second antenna 114b. Collectively, these may be referred to as a pair of antennas 114. The front end module 112 includes a first antenna port 116a and a second antenna port 116b connectible to the respective one of the first antenna 114a and the second antenna 114b. These ports may be collectively referred to as a pair of antenna ports 116. The components of the front end circuit 110 may be fabricated on a single die, and packaged along with other components as the front end module 112. The front end circuit 110 may include a first antenna pin 18a tied to the first antenna port 116a, as well as a second antenna pin 118b tied to the second antenna port 116b. These pins may be collectively referred to as a pair of antenna pins 118. The specific fabrication, integration and structure of the front end circuit 110/front end module 112 is presented by way of example only, and any other suitable configuration may be readily substituted. Thus, the terms pins, ports, and lines are referenced interchangeably, and only serve to distinguish those signal transmission paths as being associated with the front end circuit 110, the front end module 112, or the transceiver in accordance with this exemplary configuration.

In further detail, all or substantially all of the components of the front end circuit 110 are envisioned to be fabricated on a single die with common transistors structures, though some embodiments are not necessarily limited thereto, in which the components may be discretely fabricated. Suitable transistor structures include bipolar junction (BJT), hetero-junction bipolar (HBT), metal semiconductor field effect (MESFET), metal-oxide semiconductor field effect (MOSFET), and high electron mobility (HEMT). The single-die fabrication is understood to greatly reduce the footprint of the die for the front end circuit 110 as well as production costs. The die may be fabricated from a silicon substrate, a gallium arsenide (GaAs) substrate, or any other suitable semiconductor material. Any other appropriate transistor structure, semiconductor substrate, fabrication techniques, may also be utilized in accordance with various teachings in the art in light of the performance parameters of the front end circuit 110 described below.

One embodiment of the front end circuit 110 contemplates co-operating with a transceiver 120 having one transmit chain, one receive chain, one control line for the transmit chain, and two control lines for the receive chain. As briefly mentioned above, the transceiver 20 generates and receives an radio frequency (RF) signal that is compliant with a particular communications system or standard such as, for example, Wireless LAN (802.11x). Although the present disclosure sets forth a variety of configurations optimized for this communications system, those having ordinary skill in the art will recognize that the front end circuit 110 may be optimized for other communications systems, in particular, those that utilize time domain duplexing. In further detail, the transceiver 120 modulates a provided baseband data signal with an RF carrier signal that is broadcast to remote transceivers via the antennas 114. The components associated with this transmission functionality is referred to as the transmit chain. With the received RF signal from the antennas 114, the transceiver 120 demodulates the baseband signal from the carrier signal. From the baseband signal, the data is derived. The components associated with this reception functionality is referred to as the receive chain.

The transmit chain of the transceiver 120 includes a transmit port 122 that is connectible to a corresponding transmit port 123 of the front end module 112, and the receive chain of the transceiver 120 includes a receive port 124 connectible to a corresponding receive port 125 of the front end module 112. A first general purpose input/output port 126 is assigned to the control line of the transmit chain that is connectible to a transmit control line port 127. A second general purpose input/output port 128 is assigned to the first one of the control lines of the receive chain that is connectible to a first receive control line port 129, and a third general purpose input/output port 130 is assigned to the second one of the control lines of the receive chain that is connectible to a second receive control line port 131. The functionality of the various control lines will be discussed further below.

The front end circuit 110, and hence the front end module 112, is contemplated to selectively couple the pair of antennas 114 to the receive chain and the transmit chain of the transceiver 120. The reception of RF signals via the pair of antennas 114 (as opposed to a single antenna) is understood to mitigate multipath phenomena. Accordingly, robustness of communications links established therewith will be improved, with longer distance and higher data throughput communications being realized while reducing power consumption. As referenced herein, coupling the antennas 114 refers to activating certain transmission paths of the front end circuit 110 such that signals are selectively passed to the receive chain and the transmit chain. In certain embodiments, the components of the front end circuit 110 are all coupled either directly or indirectly to each other, the front end circuit 110 is not limited to embodiments where conventional switch elements are physically connected and disconnected to define such transmission paths. In general, the transceiver 120 does not generate sufficient power or have sufficient sensitivity to carry on reliable communications, and so the front end circuit 110 is also understood to perform signal amplification functions as well.

One embodiment of the front end circuit 110 includes a power amplifier 132 that has an input connectible to the transmit chain of the transceiver 120, as well as an output. As will be described further below, the output is selectively connectible to the first antenna 114a. A transmit pin 134 is connected to the output of the power amplifier 132, and in the fabrication of the front end module 112 described above, the transmit pin 134 is connected to the transmit port 123. The control line associated with the first general purpose input/output port 126 is connectible to the transmit control line port 127 of the front end module 112 as noted above, and is connected to a corresponding transmit control line pin 136 of the front end circuit 110. This, in turn, is connected to the power amplifier 132 to activate and deactivate the same. Generally, this signal transmission path is referred to as the transmit control line.

The front end circuit 110 also includes a first low noise amplifier 138 that has an output connectible to the receive chain of the transceiver 120, and an input. The input is selectively connectible to the first antenna 114a, along with the aforementioned output of the power amplifier 132. A receive pin 140 of the front end circuit 110 is connected to the output of the first low noise amplifier 138. The receive pin 140 of the front end circuit 110, in turn, is connected to the receive port 125 of the front end module 112. The control line associated with the second general purpose input/output port 128 is connectible to the first receive control line port 129 of the front end module 112, and is connected to a corresponding first receive control line pin 142. Based upon signals applied to the first receive control line pin 142, the first low noise amplifier 138 is activated and deactivated. Accordingly, the signal transmission path including these components is referenced as the first receive control line.

There is also a second low noise amplifier 144 connected to the second antenna port pin 18b, and the second antenna port 116b, to which the second antenna 114b is connected. The output of the second low noise amplifier 144 is likewise connected to the receive pin 140 of the front end circuit 110, and in turn, the receive port 120 of the front end module 112. A different, second control line associated with the third general purpose input/output port 130 is connectible to the second receive control line port 131 of the front end module 112, which in turn is connected to a corresponding second receive control line pin 146. The second low noise amplifier 144 is activated and deactivated with signals applied to the second receive control line pin 146. The signal transmission path including the second receive control line pin 146 and the second receive control line port 131 is referenced as the second receive control line.

As indicated above, both the power amplifier 132 and the first low noise amplifier 138 are each selectively connectible to the first antenna 114a. That is, transmit signals from the power amplifier 132 are selectively passed to the first antenna 114a, and the receive signals from the antenna 114a are selectively passed to the first low noise amplifier 138. A matching and switch network 148 is contemplated for this function, with the output of the power amplifier 132 and the input of the first low noise amplifier 138 being connected thereto. One embodiment of the matching and switch network 148 is disclosed in Applicant's co-pending U.S. patent application Ser. No. 12/412,226 filed Mar. 26, 2009 entitled RADIO FREQUENCY FRONT END CIRCUIT, which is expressly incorporated by reference in its entirety herein. Additionally, the first antenna 114a is connected to the matching and switch network 148 via the first antenna pin 118a of the front end circuit 110. Further details pertaining to the functionality of the matching and switch network 148 will be considered below. In general, however, the power amplifier 132 and the first low noise amplifier 138 are activated in exclusive relation to each other, and although there is a shared signal path in the matching and switch network 148, it is configured in such a manner to minimize interference between transmission and reception.

Along these lines, the output of the first low noise amplifier 138 and the output of the second low noise amplifier 144 are both connected to the receive chain. As noted above, the front end circuit 10 includes the receive pin 140 that is connectible to the receive port 124 of the transceiver 120, and to which the outputs of the low noise amplifiers 138, 144 are connected. More particularly, there is a power combiner circuit 150 that has a first port 152 connected to the output of the first low noise amplifier 138, a second port 154 connected to the output of the second low noise amplifier 144, and a third port 156 connected to the receive pin 140. The power combiner circuit 150 may be implemented on the same die as the other amplifier components as described above, with active or passive components. It is contemplated that the power combiner circuit 150 minimizes the influence of the first low noise amplifier 138 on the second low noise amplifier 144, and vice versa. Furthermore, the design of the output matching circuit for the receive port 124 of the transceiver 120 is simplified. Although the power combiner circuit 150 reduces the overall gain of the first low noise amplifier 138 and the second low noise amplifier 144 typically by about 3 dB, the respective amplifier circuitry may have multiple stages to compensate. Furthermore, as the power combiner circuit 150 is connected to the respective outputs of the first low noise amplifier 138 and the second low noise amplifier 144, there is minimal impact on the overall noise figure of the receive chain with each low noise amplifier stage having a sufficient gain of at least 8 dB. As will be described in further detail below, the first low noise amplifier 138 and the second low noise amplifier 144 have similar, if not substantially identical performance characteristics.

Based upon the foregoing configuration of the front end circuit 110, another embodiment contemplates that the noted selectively activatable components, that is, the power amplifier 132, the first low noise amplifier 138, the second low noise amplifier 144, and the matching and switch network 148, together define several operational modes. These include a transmit mode, a first receive mode, a second receive mode, a dual receive mode, and a hybrid mode.

In the transmit mode, the power amplifier 132 is turned on, while the first low noise amplifier 138 and the second low noise amplifier 144 are turned off. Thus, in some embodiments, the transmit mode may be exclusive of all other operational modes. The matching and switch network 148 is controlled to pass the transmit signal from the power amplifier 132 to the first antenna pin 118a, where it is broadcast via the first antenna 114a.

In the first receive mode, the first low noise amplifier 138 is turned on, while the power amplifier 132 and the second low noise amplifier 144 are turned off. The matching and switch network 148 is controlled to pass the signal from the first antenna 114a being applied to the first antenna pin 118a of the front end circuit 110 to the first low noise amplifier 144. The amplified receive signal from the first low noise amplifier 138 is passed to the first port 152 of the power combiner circuit 150, which is then passed to the third port 156 of the same. Through the receive port 125 of the front end module 112, to which the third port 156 of the power combiner circuit 150 is connected, the received and amplified signal from the first antenna 114a is thus passed to the receive port 124 of the transceiver 120.

In the second receive mode, the second low noise amplifier 144 is turned on, while the power amplifier 132 and the first low noise amplifier 138 are turned off. It is thus contemplated that the second receive mode is exclusive of the first receive mode, and vice versa, in some embodiments. The signal received on the second antenna 114b is passed through the second antenna port 118b of the front end circuit 112, and to the second low noise amplifier 144. The amplified receive signal from the second low noise amplifier 138 is passed to the second port 154 of the power combiner circuit 150, which is then passed to the third port 156 of the same. Through the receive port 125 of the front end module 112, this amplified signal is passed to the receive port 124 of the transceiver 120.

As noted above, some variations of receive antenna diversity involve the selection of the stronger signal by the transceiver 120. The selecting of which of the first antenna 114a or the second antenna 114b to utilize is thus implemented through activating and deactivating the corresponding low noise amplifiers.

There is also a third receive mode, in which both the first low noise amplifier 138 and the second low noise amplifier 144 are activated simultaneously, with the amplified signals from each being summed by the power combiner circuit 150 to be passed to the transceiver 120. In further detail, the power amplifier 132 is deactivated, and the matching and switch network 148 is controlled to pass the receive signals from the first antenna 114a to the activated first low noise amplifier 138. At the same time, the receive signals from the second antenna 114b are passed to the second low noise amplifier 144. Thus, the third receive mode may be exclusive of the aforementioned first and second receive modes.

A hybrid mode is also contemplated, where a transmit signal is generated by the transceiver 120 at the same time as receiving a signal from a counterpart transceiver. Typically, in these embodiments, the transmit signal has a different operational frequency than the received signal to limit interference. In this mode, the power amplifier 132 is activated, while the first low noise amplifier 138 is deactivated. The matching and switch network 148 is controlled to pass the transmit signals from the power amplifier 132 to the first antenna pin 118b. At the same time, the second low noise amplifier 144 is activated, and the receive signals from the second antenna 114b are passed to the receive chain.

In accordance with one embodiment of the front end module 112, there may be a band pass filter 158 interposed between the receive pin 140 of the front end circuit 110 and the receive port 125. The band pass filter 158 is understood to be suitable in configurations where out-of band, large blocking signals are present and have the potential of deteriorating receiver performance. However, the band pass filter 158 is optional. Where utilized, the band pass filter 158 may be a part of the front end module 112, or alternatively, fabricated on the same die as the front end circuit 110.

Figure 2:
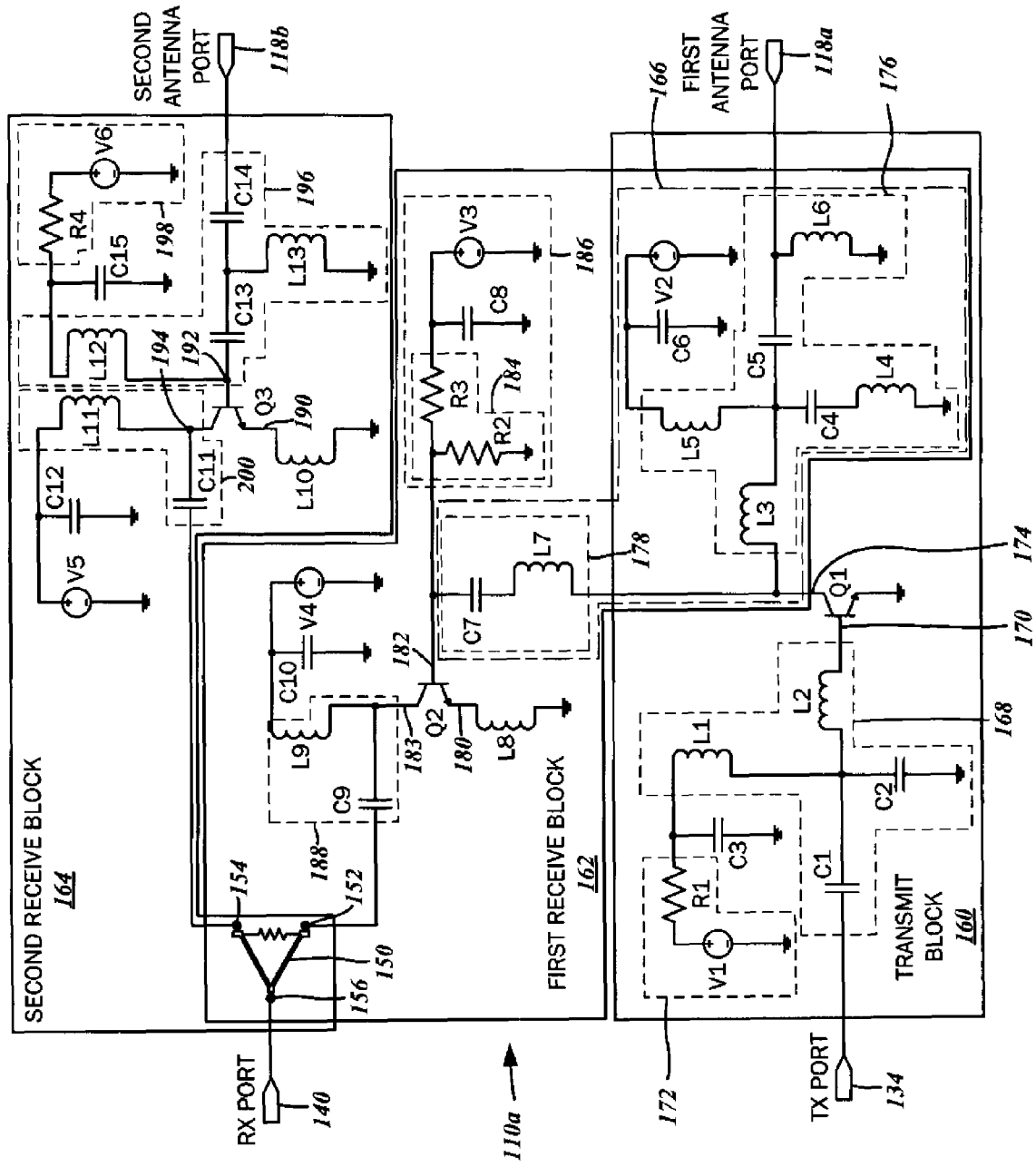
FIG. 2 is a schematic diagram of a first variation of the front end circuit shown in the block diagram of FIG. 1.

Referring now to the schematic diagram of FIG. 2, there is illustrated a first variation 110a of one embodiment of the front end circuit 110, which is generally defined by a first transmit block 160, a first receive block 162, and a second receive block 164. The first transmit block 160 includes the power amplifier 132, while the first receive block 162 includes the first low noise amplifier 138 and the second receive block 164 includes the second low noise amplifier 144. Additionally, a segment of the first transmit block 160 and the first receive block 162 defines a shared transmit/receive block 166 that corresponds to the matching and switch network 148. The transmit block 160 includes the transmit pin or port 134, and the first and second receive blocks 162, 164 includes the receive pin or port 140. The shared transmit/receive block 166 includes the first antenna pin or port 118a, while the second receive block 164 includes the second antenna pin or port 118b. As indicated above, the first antenna 114a is connected to the first antenna pin or port 118a, and the second antenna 114b us connected to the second antenna pin or port 118b.

The power amplifier 132 of the first transmit block 160 may, according to one embodiment, be a single stage power amplifier with a transistor Q1 in a common emitter configuration. It is understood that multi-stage amplifiers may also be utilized for higher gain applications, and those having ordinary skill in the art will recognize the appropriate modifications to the basic configuration presented herein for such multi-stage amplifiers. Generally, the transistor Q1, as well as the other transistors of the front end circuit 110 contemplated herein, have a bipolar junction structure, though in some embodiments, they may have a field effect structure (MOSFET, MESFET, etc.) While the present disclosure variously references bases, collectors, and emitters of bipolar junction transistors, it is to be understood that such elements directly correspond to the gates, drains, and sources of field effect transistors.

The power amplifier 132 includes circuitry for matching the input of the front end circuit 110 to the 50 Ohm output impedance of the transceiver 120, as is common in most RF systems. The components of a power amplifier input matching network 168 includes capacitors C1 and C2, as well as inductors L1 and L2, which match the transmit pin or port 134 to a base 170 of the transistor Q1 while it is being turned on and off in the predefined operating frequency range. The capacitor C1 is tied to the transmit pin or port 134, the capacitor C2, and the inductors L1 and L2. The inductor L2 is tied to the base 170, and the capacitor C2 is tied to ground. The power amplifier input matching network 168 may be variously configured according to different gain, linearity, and wideband operation requirements.

Tied to the inductor L1 is an adjustable voltage source V1 that sets the bias point of the transistor Q1 of the power amplifier 132 through a resistor R1. The bias conditions, in conjunction with the size or geometry of the transistor Q1, are chosen to maximize the operating power level at the first antenna 118a during transmission. Additionally, an RF decoupling capacitor C3 having a sufficiently high capacitance value is connected to the voltage source V1 through the resistor R1. These components are understood to comprise one embodiment of a first control circuit 172 that is connected to the first control line, i.e., the first general purpose input/output port 126 of the transceiver 120, the transmit control line port 127 of the front end module 112, and the transmit control line pin 136 of the front end circuit 110. As indicated above, a variable voltage may be generated intermittently by the transceiver 120 on the first general purpose input/output port 126 and thus the transistor Q1, to activate and deactivate the same. The first control circuit 172 is not intended to be limited to the voltage supply circuit considered above, and any other suitable supply such as a current minor may be readily substituted.

The first transmit block 160, and specifically the collector 174 of the transistor Q1, is connected to the shared transmit and receive block 166 that generally corresponds to the matching and switch network 148. The matching and switch network 148 is defined by a power amplifier output matching segment 176 that includes inductors L3, L4, L5 and L6, as well as capacitors C4, C5. The power amplifier output matching segment 176 impedance matches the transistor Q1 to the first antenna 114a at the predefined operating frequency when active. The collector 174 of the transistor Q1 is connected to the inductor L3, which in turn is connected to capacitors C4 and C5, and the inductor L5. The values of the capacitor C4 and the inductor L4 connected in series thereto and to ground are selected to provide a series resonance at the second harmonic of the predefined operating frequency. A voltage source V2 is connected to the inductor L5, and provides biasing to the collector 174 of the transistor Q1. Similar to the voltage source V1, an RF decoupling capacitor C6 is connected between the voltage source V2 and ground.

The power amplifier output matching segment 176 is configured in a way that the resistive part of the impedance at the collector 174 of the transistor Q1 is equal or below the resistive component of an output impedance or transistor load impedance for the activated transistor Q1 that corresponds to a predetermined 1 dB compression point (P1 dB) at a specific bias voltage. In this regard, the power amplifier output matching segment 176 is loaded at the antenna side by a predefined load (typically 50 Ohms) while the first receive block 162, including a first low noise amplifier input matching segment 178, is disconnected.

As described above, the shared transmit and receive block 166 is connected to the first receive block 162, which includes the first low noise amplifier 138 and other associated circuitry. A transistor Q2 is that of the first low noise amplifier 138, and is in a common-emitter configuration. Additionally connected to an emitter 180 of the transistor Q2 is an optional degeneration inductor L8 that is tied to ground. In some cases, the base-emitter impedance of the transistor Q2 may be better matched to the first antenna 118a.

The matching and switch network 148 includes the first low noise amplifier matching segment 178, which is comprised of a capacitor C7 and an inductor L7 that are exclusive thereto. The first low noise amplifier matching segment 178 is combined with the inductors L3, L4, L5, and L6 and capacitors C4 and C5, which are shared with the power amplifier output matching segment 176, to impedance match the first low noise amplifier 138 to the first antenna 114a while active. The capacitor C7 and the inductor L7 are connected in series to the collector 174 of the transistor Q1 and a base 182 of the transistor Q2.

In accordance with various embodiments, a component of the matching and switch network 148, specifically the inductor L6, has an electrostatic discharge function. The resistive component of the inductor L6 is contemplated to have a value less than 5 Ohm to provide a direct current pass from the first antenna port 118b to ground in case a high voltage is accidentally applied. Accordingly, the need for electronic discharge circuitry that degrades signal transmission performance, as is common in silicon substrate-based semiconductor devices, is eliminated.

A number of factors are applicable to the optimal configuration of the first low noise amplifier 138 and the first low noise amplifier input matching segment 178. In particular, the size or geometry of the transistor Q2 is selected such that the resistive component of an input impedance of an activated transistor Q2 is substantially similar to the resistive component of an output impedance required for the activated transistor Q1 of the power amplifier 132. The values of the capacitor C7 and the inductor L7 are selected to achieve a minimal noise figure (NF) between the first antenna 114a and the output of the first low noise amplifier 138, as well as a minimal input return loss ($S_{11}$), for an activated transistor Q2 and a deactivated transistor Q1 of the power amplifier 132. One embodiment contemplates an input return loss ($S_{11}$) of less than −10 dB.

The capacitor C7 and the inductor L7 are selected to correspond to a substantially minimized voltage swing at the base 182 of the transistor Q2. When the power amplifier 132 is on, an optimized configuration minimizes the voltage being applied to the first low noise amplifier 138 to prevent the transistor Q2 from conducting while the base-emitter resistance decreases, thereby degrading the transmitted RF signal.

Generally, the smallest value of the capacitor C7 is understood to result in the minimum voltage amplitude at the base-emitter junction of the transistor Q2 when the transistor Q1 is on and the transistor Q2 is off, thus increasing its reliability. Additionally, linearity of the power amplifier 132 is achieved at higher transmit power levels. Avoiding a resonance frequency of the first low noise amplifier input matching segment 178 close to the predefined operating frequency also decreases voltage swing at the base-emitter junction of the deactivated transistor Q2, so in one exemplary configuration, the resonance frequency is set to be at least a few hundred MHz higher.

An adjustable voltage source V3 is also connected to the base 182 of the transistor Q2 for activating and setting the bias point of the first low noise amplifier 138. As previously noted, a variable voltage may be generated intermittently by the transceiver 120 on the second general purpose input/output port 128 and so the first low noise amplifier 138 is activated and deactivated thereby. The voltage is provided through a resistive divider 184 that includes a resistor R3 connected to the adjustable voltage source V3 and a resistor R2 connected to ground and the resistor R3. The junction between the resistor R2 and the resistor R3 is tied to the base 182 of the transistor Q2. The resistive divider 184 is configured to have a sufficient resistance to prevent shunting of the impedance at the base 182 of the transistor Q2, that is, the base-emitter resistance of the activated transistor Q2 is less than that of the resistive divider 184. An RF decoupling capacitor C8 is also connected to the voltage source V3. These components are understood to comprise one embodiment of a second control circuit 186. As with the first control circuit 172, the second control circuit 186 is not intended to be limited to a voltage supply as indicated above, and other configurations such as a current mirror are also suitable.

A voltage source V4 biases the transistor Q2, and is connected to a collector 183 of the transistor Q2 over the inductor L9. As with the other voltage sources in the front end circuit 110, an RF decoupling capacitor C10 is connected to the voltage source V4.

The collector 183 of the transistor Q2 is also connected to first low noise amplifier output matching network 188 that is connected to the first port 152 of the power combiner circuit 150. The transceiver 120 is thus impedance matched to the first low noise amplifier 138. The first low noise amplifier output matching network 188 includes an inductor L9 and a capacitor C9, and a variety of configurations are possible depending on the gain, noise figure, linearity, and wide-band operation requirements. The values of the capacitor C9 and the inductor L9 are selected to achieve a pure resistive impedance in the predefined operating frequency range at the first port 152 of the power combiner circuit 150 with the transistor Q2 being activated. Resistive impedance at the first port 152 is selected to minimize the pure resistive part of the impedance at the collector 183 of the transistor Q2 for a high 1 dB gain compression (P1 dB) at the first port 152. This is contemplated for sustaining large blocking signal levels received by the first antenna 114a.

The second receive block 164, which is understood to generally correspond to the second low noise amplifier 144, is also connected to the receive port 122 via the power combiner circuit. A transistor Q3 is that of the second low noise amplifier 144, and is in a common-emitter configuration. Connected to an emitter 190 of the transistor Q3 is an optional degeneration inductor L10 that is tied to ground.

A base 192 of the transistor Q3 is connected to a second low noise amplifier input matching network 196 that includes capacitors C13 and C14, and inductors L12 and L13. The second low noise amplifier input matching network 196 is understood to match the impedance of the second antenna 114b (typically 50 Ohms) to the second low noise amplifier 144 as it is being turned on and off in the predefined operating frequency range. The particular configuration of the second low noise amplifier input matching network 196 may vary depending upon gain, noise figure, linearity, and wide-band operation requirements.

Also connected to the base 192 of the transistor Q3 is a third control circuit 198 that includes a voltage source V6 and a resistor R4. The voltage source V6 is understood to set the bias point of the transistor Q3 through the resistor R4 and the inductor L12, as well as to activate and deactivate the same. There is also a RF decoupling capacitor C15 connected to the junction between the inductor L12 and the resistor R4.

A collector 194 of the transistor Q3 is connected to a voltage source V5 through an inductor L11 that biases the transistor Q3. As with other voltage sources, there is an RF decoupling capacitor C12 connected to the voltage source V5.

The second receive block 164 further includes a second low noise amplifier output matching network 200 that includes a capacitor C11 and the inductor L11. The values of the capacitor C11 and the inductor L11 are selected to achieve a pure resistive impedance in the predefined operating frequency range at the second port 154 of the power combiner circuit 150 with the transistor Q3 being activated. The transceiver 120 is thus impedance matched to the second low noise amplifier 138. A variety of configurations of the second low noise amplifier output matching network 200 are possible depending on the gain, noise figure, linearity, and wide-band operation requirements.

Having considered the details of the first low noise amplifier 138 and the second low noise amplifier 144, which are connected to the respective first and second ports 152, 154 of the power combiner circuit 150, further specificities of the power combiner circuit 150 will now be discussed. In generally the power combiner circuit 150 is understood to have a pure resistive impedance at the first port 152, second port 154, and the third port 156 at the predefined operating frequency range. Additionally, power loss between the first port 152 and the third port 156, as well as between the second port 154 and the third port 156 is minimized. In one contemplated embodiment, such losses are limited to less than 0.5 dB. Isolation between the first port 152 and the second port 154 is maximized where the third port 156 is perfectly matched, and may be higher than 20 dB. Power applied to the third port 156 is understood to be split equally, with equal power levels, to the first port 152 and the second port 154. The power levels at the first port 152 and the second port 154 may be 3 dB less than the power level applied to the third port 156. Along these lines, the impedance value at the third port 156 may be two times lower than the impedance value at the first port 152 or the second port 154. The power combiner circuit 150 may have various architectures, and may be a Wilkinson-type, lumped element based, coupled element based, and so forth. Those having ordinary skill in the art will ascertain the appropriate configuration in light of the requirements noted above, in addition to alternatives that contemplate non-equal power division ratios and non-equal impedance values at the first and second ports 152, 154.

In light of the foregoing description of the front end circuit 110a, it will be appreciated that the transistors Q1, Q2, and Q3 are selectively activated to perform the role of an RF switch during the various transmission and reception modes. A conventional RF switch typically has 0.5 dB to 0.7 dB losses in the 2-6 GHz frequency range. Elimination of such devices from the front end circuit 110 is contemplated to increase transmission efficiency, as well as enhance the overall noise figure for reception.

In further detail, in the transmit mode, the transistor Q1 is on with the voltage source V1 being activated, and the transistors Q2 and Q3 are turned off with the voltage sources V3 and V6 being deactivated or set to below the threshold levels. The RF signal applied to the transmit pin or port 134 is amplified by the power amplifier 132, that is, the transistor Q1, and passed to the first antenna pin or port 118a.

In the first receive mode, the transistor Q2 is on with the voltage source V3 being activated, while the transistors Q1 and Q3 are turned off with the respective voltages sources V1 and V6 being deactivated or set to below the threshold levels. The RF signal from the first antenna 114a as applied to the first antenna port 118a is passed to the first low noise amplifier 138, that is, the transistor Q2. The received, amplified signal is passed to the first port 152 of the power combiner circuit 150, and to the receive pin or port 140.

In the second receive mode, the transistor Q3 is on with the voltage source V6 being activated, while the transistors Q1 and Q2 are turned off with the respective voltage sources V1 and V3 being deactivated or set to below the threshold levels. The RF signal from the second antenna 114b as applied to the second antenna port 118b is passed to the second low noise amplifier 144, which is the transistor Q3. The signal is then passed to the second port 154 of the power combiner circuit 150, and to the receive pin or port 140.

In the third receive mode, the transistor Q2 and Q3 are on with the respective voltage sources V3 and V6 being activated, while the transistor Q1 is turned off with the corresponding voltage source V1 being deactivated or set to below the threshold levels. The RF signal from the first antenna 114a is amplified by the first low noise amplifier 138, i.e., the transistor Q2, and the RF signal from the second antenna 114b is amplified by the second low noise amplifier 144, i.e., the transistor Q3. Both of the amplified signals are combined at the third port 156 of the power combiner circuit 150 and passed to the receive pin or port 140.

Figure 3:
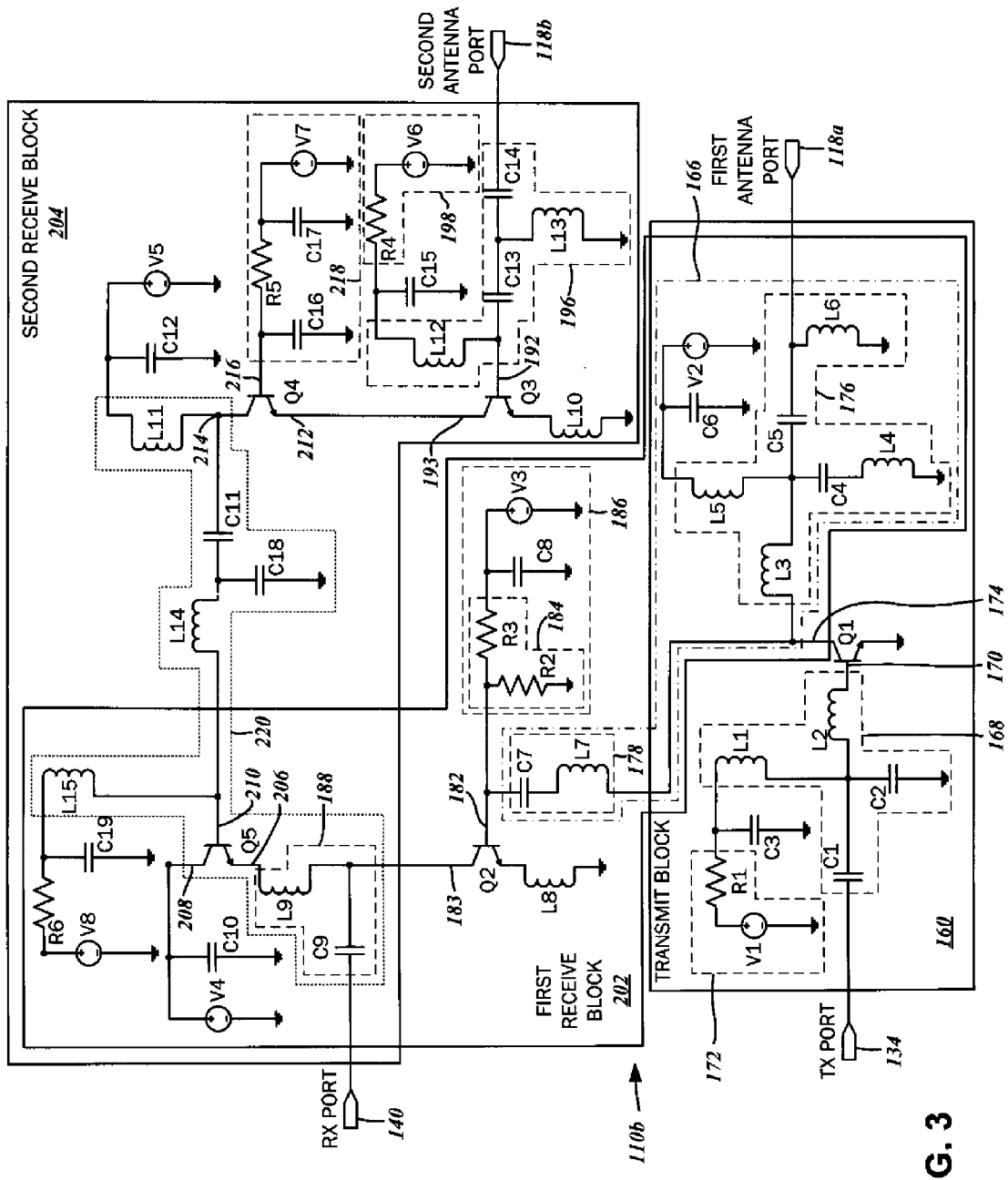
FIG. 3 is a schematic diagram of a second variation of the front end circuit shown in the block diagram of FIG. 1.

FIG. 3 is a circuit schematic of a second variation 110b of the front end circuit 110 described above. The transmit block 160 and the shared transmit/receive block 166 of the front end circuit 110b are identical to that of the first variation 110a, however, there are several noted differences in a first receive block 202 and a second receive block 204 that will be discussed more fully below. In general, the first variation 110a utilizes a generic power combiner circuit 150, while the second variation 110b utilizes a specific implementation thereof that involves modifications to the first receive block 162 and the second receive block 164 of the first variation 110a.

The transmit block 160 includes the transmit pin or port 134 that is connectible to the transmit port 122 of the transceiver 120. The first receive block 202 and the second receive block 204 include the receive pin or port 140. The shared transmit/receive block 166 includes the first antenna pin or port 118a, to which the first antenna 114a is connected, and the second receive block 204 includes the second antenna pin or port 118b, to which the second antenna 114b is connected.

As indicated, the features of the transmit block 160 are common with that of the first variation 110a of the front end circuit, and includes the single stage power amplifier 132 with the transistor Q1 in the common emitter configuration. The power amplifier 132 includes the power amplifier input matching network 168 including capacitors C1 and C2, and inductors L1 and L2. The power amplifier input matching network 168 is understood to match the transmit pin or port 134 to the base 170 of the transistor Q1 while it is being turned on and off in the predefined operating frequency range, and may be variously configured according to particular gain, linearity, and wideband operation requirements. The adjustable voltage source V1 sets the bias point of the transistor Q1, and together with the resistor R1, defines the first control circuit 172. As indicated above, the adjustable voltage source V1 is understood to correspond to the transmit control line.

The transmit block 160 likewise includes the shared transmit/receive block 166 with the power amplifier matching segment 176. As previously set forth, the power amplifier matching segment 176 includes the capacitors C4 and C5, and the inductors L3, L4, L5, and L6. Further, the voltage source V2 biases the collector 174 of the transistor Q1 through the inductors L3 and L5. Along these lines, some features of the receive block 202 of the second variant 110b are common with that of the first variation 110a. Namely, the shared transmit/receive block 166 is the same, and has the first low noise amplifier input matching segment 178 including the capacitor C7 and inductor L7 discussed above. The specific optimizations for the shared transmit/receive block 166, which generally correspond to the matching and switch network 148, are understood to follow the same considerations previously addressed, and will not be repeated. In addition, the receive block 202 of the second variant 110b is understood to include the second control circuit 186 with the voltage source V3 that is connected to the base 182 of the transistor Q2 over a resistive divider 184. The optimizations for these components are also understood to follow the same considerations as previously discussed, and will likewise not be repeated.

With respect to the first receive block 202, the collector 183 of the transistor Q2 is connected to the first low noise amplifier output matching network 188, which in turn is connected to the receive pin or port 140. The first low noise amplifier output matching network 188 includes the inductor L9 and capacitor C9. Additionally, the collector 183 of the transistor Q2 is connected to an emitter 206 of a transistor Q5. A collector 208 of the transistor Q5 is connected to a voltage source V4, which is understood to provide a bias voltage to the transistor Q2 through the inductor L9. Essentially, the transistor Q5 operates as a direct current (DC) current bias switch. The voltage source V4 is also connected to an RF decoupling capacitor C10. This DC current bias switch is controlled by a voltage source V8, which through a resistor R6 and an inductor L15, sets the bias point, and activates and deactivates the transistor Q5. The inductor L15 is connected to a base 210 of the transistor Q5.

The second receive block 204 also shares similarities to its counterpart in the first variation 110a. This includes the transistor Q3, which is in a common emitter configuration with the optional degeneration inductor 110. Furthermore, the base 192 of the transistor Q3 is connected to the second low noise amplifier input matching network 196 including the capacitors C13 and C14 and the inductors L12 and L13. The second low noise amplifier input matching network 196 is connected to the second antenna port 118b, and is understood to match the second low noise amplifier 144 to the second antenna 114b. The third control circuit 198 that includes a voltage source V6 and a resistor R4 is connected to the base 192 of the transistor Q3. The voltage source V6 is understood to set the bias point of the transistor Q3 through the resistor R4 and the inductor L12, as well as to activate and deactivate the same.

A transistor Q4 (specifically, its emitter 212) is connected to the collector 193 of the transistor Q3 in a cascode configuration. A bias voltage source V5 is applied to the collector 214 of the cascode transistor Q4 through an inductor L11, and a RF decoupling capacitor C12 is connected to the voltage source V5. A fourth control circuit 218 including the voltage source V7 is connected to a base 216 of the transistor Q4 through a resistor R5. It is contemplated that the fourth control circuit 218 and the third control circuit 198 are activated and deactivated simultaneously, that is, both the voltage source V6 and V7 are tied to the second receive control line. A capacitor C16 between the base 216 of the transistor Q4 and ground is selected to satisfy overall stability requirements, and an RF decoupling capacitor C17 is connected to the voltage source V7.

The transistor Q3 and the cascode transistor Q4 is understood to correspond to the second low noise amplifier 144. In this regard, a second low noise amplifier output matching network 220 for the second variation 110b different from that of the first variation 110a is contemplated. A first segment includes the inductor L11 and the capacitor C11. A second segment includes inductors L14 and L15, the capacitor C18, the base-emitter junction of the transistor Q5, the inductor L9, and the capacitor C9. The components of the first and second segments of the second low noise amplifier output matching network 220 are selected to match the impedance at the collector 214 of the transistor Q4 with the impedance of the receive pin or port 140, which is typically 50 Ohms. Further, the components are selected to minimize loss introduced by the base-emitter junction of the transistor Q5. This is typically below 2 dB. As indicated in relation to other matching networks, the second low noise amplifier output matching network 220 may have different configurations depending upon gain, noise figure, linearity, and wide-band operation requirements.

Again, in light of the foregoing description of the front end circuit 110b, it will be appreciated that the transistors Q1, Q2, Q3, and Q4 are selectively activated to perform the role of an RF switch during the various transmission and reception modes. In further detail, in the transmit mode, the transistor Q1 is on with the voltage source V1 being activated, and the transistors Q2, Q3, Q4 and Q5 are turned off with the respective voltage sources V3, V6, V7 and V8 being deactivated or set to below the threshold levels. The RF signal applied to the transmit pin or port 134 is amplified by the power amplifier 132, that is, the transistor Q1, and passed to the first antenna pin or port 118a.

In the first receive mode, the transistors Q2 and Q5 are on with the respective voltage sources V3 and V8 being activated, while the transistors Q1, Q3 and Q4 are turned off with the respective voltages sources V1, V6 and V7 being deactivated or set to below the threshold levels. The RF signal from the first antenna 114a as applied to the first antenna port 118a is passed to the first low noise amplifier 138, that is, the transistor Q2. The received, amplified signal is passed to the receive pin or port 140. The transistor Q5 is operating as a DC bias switch, as indicated above.

In the second receive mode, the transistors Q3 and Q4 are on with the respective voltage sources V6 and V7 being activated, while the transistors Q1, Q2, and Q5 are turned off with the respective voltage sources V1, V3, and V8 being deactivated or set to below the threshold levels. The RF signal from the second antenna 114b as applied to the second antenna port 118b is passed to the second low noise amplifier 144, which is the transistor Q3 and the cascode transistor Q4. The signal is passed through the base-emitter junction of the transistor Q5 to the receive pin or port 140, with current drain through the transistors Q2 and Q5 being almost zero. There is a possibility for other combinations of control voltages applied to the transistors Q2 and Q5. Both the transistors Q2 and Q5 may be on, the transistor Q2 may be on while the transistor Q5 may be off, or the transistor Q2 may be off while the transistor Q5 may be on. It is understood that differing linearity levels are provided for the receive signal at the receive pin or port 140 depending upon the combination.

Figure 4:
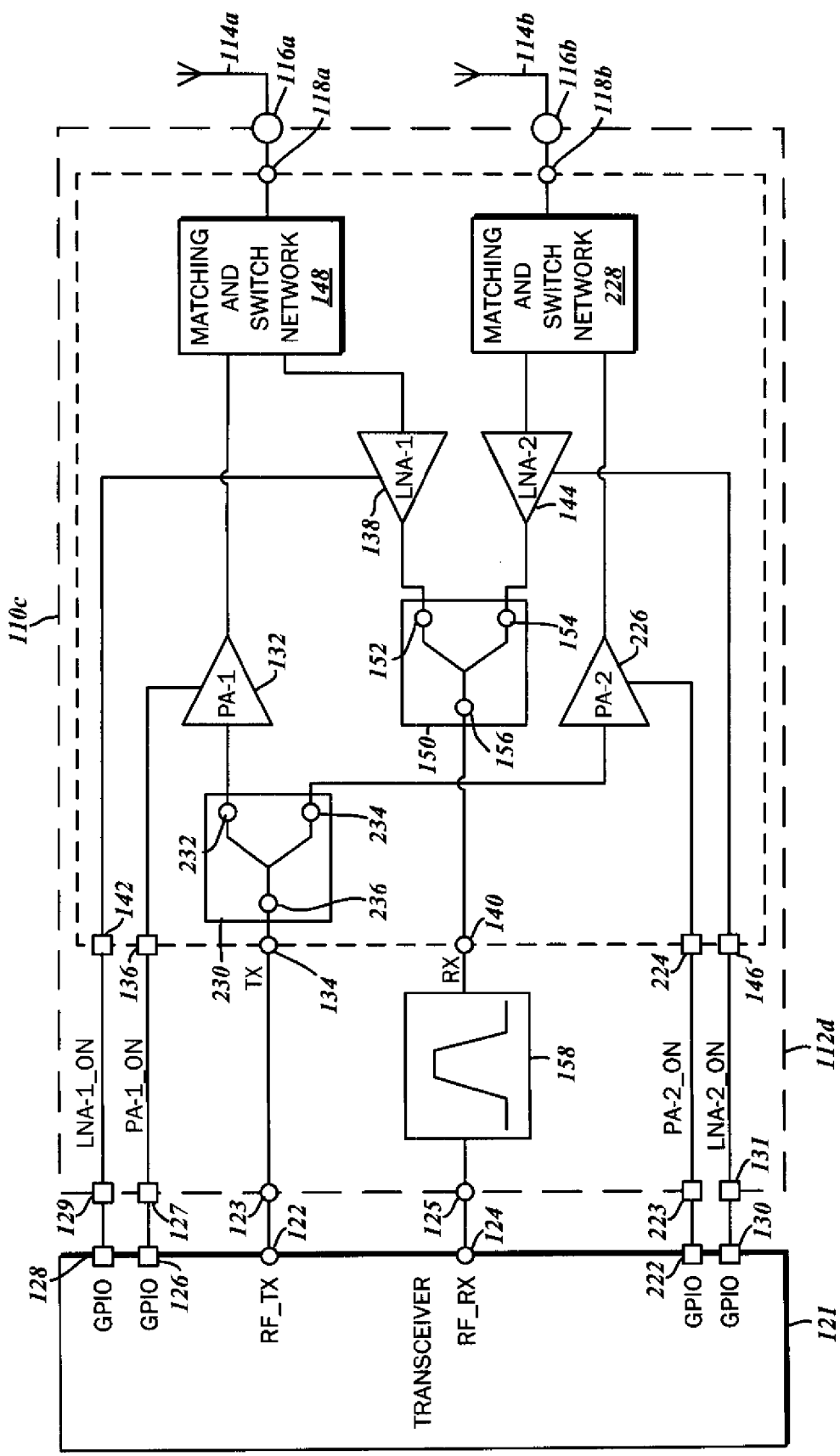
FIG. 4 is a block diagram of another embodiment of the front end circuit connected to the transceiver and the pair of antennas for receive and transmit diversity.

The first variation 110a and the second variation 110b of the front end circuit are understood to be utilized for receive antenna diversity. With reference to the block diagram of FIG. 4, another embodiment of the present disclosure contemplates a third variation 110c in which both transmit and receive antenna diversity is implemented. All of the components in the first variation 110a are utilized, including the first power amplifier 132, the first low noise amplifier 138, the second low noise amplifier 144, the power combiner circuit 150, and the matching and switch network 148. Accordingly, details of operation previously considered will not be repeated. As indicated above, some embodiments contemplate the use of the band pass filter 158, and the third variation 110c may also utilize the same. Like the transceiver 120 utilized in the first variation 110c, a transceiver 121 includes the transmit port 122, the receive port 124, a first general purpose input/output port 126 for the transmit control line, a second general purpose input/output port 128 for the first receive control line, and a third general purpose input/output port 130 for the second receive control line. There is one difference with respect to the transceiver 121, however, which is the inclusion of a fourth general purpose input/output port 222. The corresponding port on the front end module 112 to which the fourth general purpose input/output port 22 is connectible is a second transmit control line port 223, and the corresponding pin on the front end circuit 110c is a second transmit control pin 224. Further details pertaining to the application of the second transmit control line will be discussed more fully below.

For transmit antenna diversity, the front end circuit 110c includes a second power amplifier 226, so either one or both of the antennas 118 may be utilized to broadcast the transmit RF signal. As such, the power amplifier 132 will hereinafter be referred to as the first power amplifier to distinguish from the second power amplifier 226. The aforementioned first and second variations 110a, 110b envisioned selectively connecting one of the first power amplifier 132 and the first low noise amplifier 138 to the first antenna 114a over the matching and switching network 148, while the second low noise amplifier 144 was connected directly to the second antenna 114b. However, with the inclusion of the second power amplifier 226, this variation contemplates selectively connecting one of the second power amplifier 226 and the second low noise amplifier 144 to the second antenna 114b over a second matching and switch network 228 having a similar configuration as the (first) matching and switch network 148 that functions under the same principles as discussed above.

Along these lines, there are two inputs for the respective first and second power amplifiers 132, 226 but only one transmit port 122 on the transceiver 121 and the corresponding transmit pin or port 134 on the front end circuit 110c. Therefore, the third variation 110c contemplates a power divider circuit 230 with a first port 232, a second port 234, and a third port 236. The input of the first power amplifier 132 is connected to the first port 232, while the input of the second power amplifier 226 is connected to the second port 234. The third port 236 is connected to the transmit pin or port 134. In this regard, the transmit signal from the transmit port 122 of the transceiver 121 is split between the first port 232 for amplification by the first power amplifier 132 for transmission over the first antenna 114a, and the second port 234 for amplification by the second power amplifier 226 for transmission over the second antenna 114b (with the respective matching and switch networks 148, 228 being controlled accordingly). It is understood that the configuration of the power divider circuit 230 is substantially identical to that of the power combiner circuit 150.

Figure 5A:
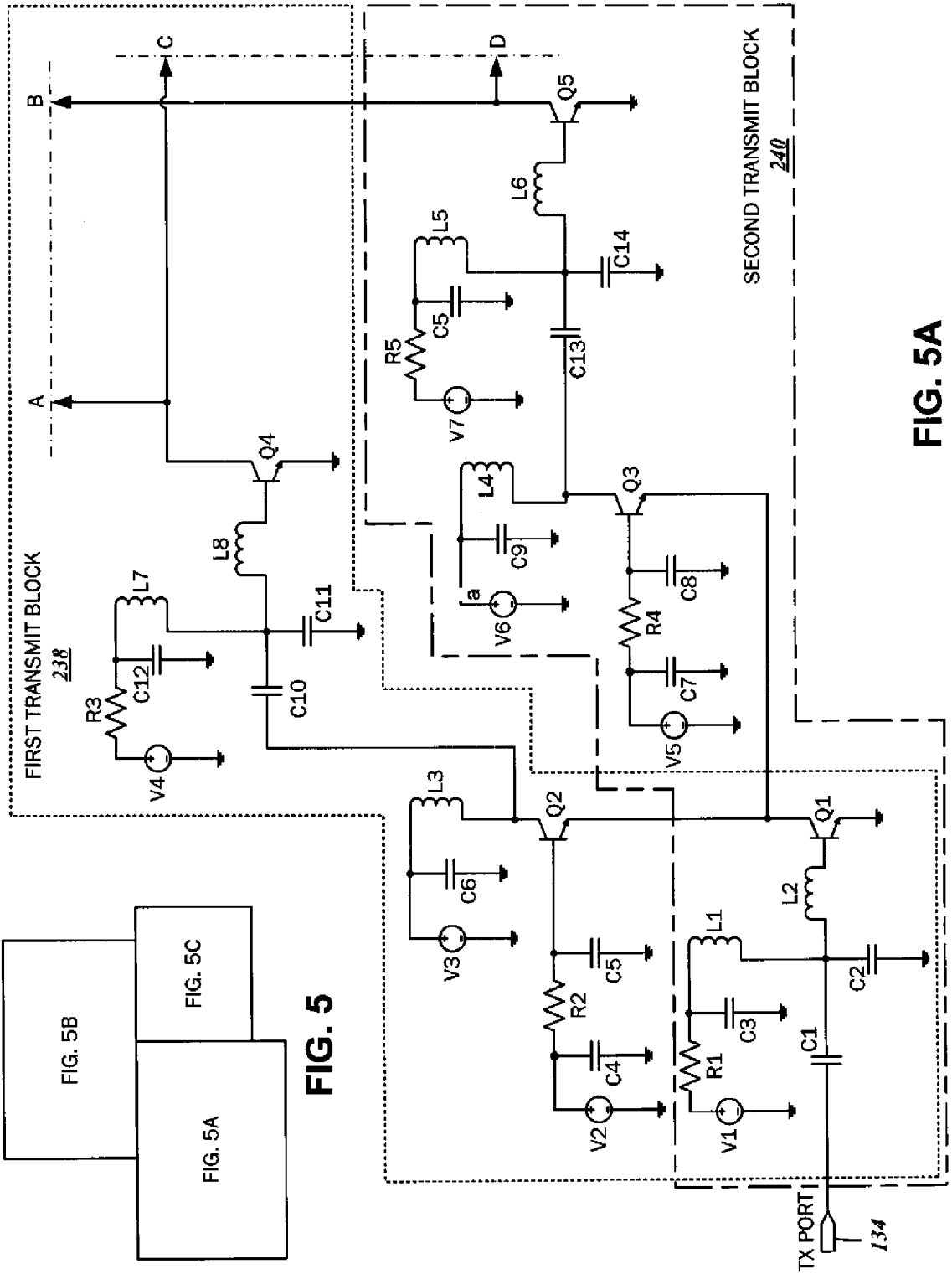
FIGS. 5A-5C are schematic diagrams of the front end circuit shown in FIG. 4.
Figure 5B:
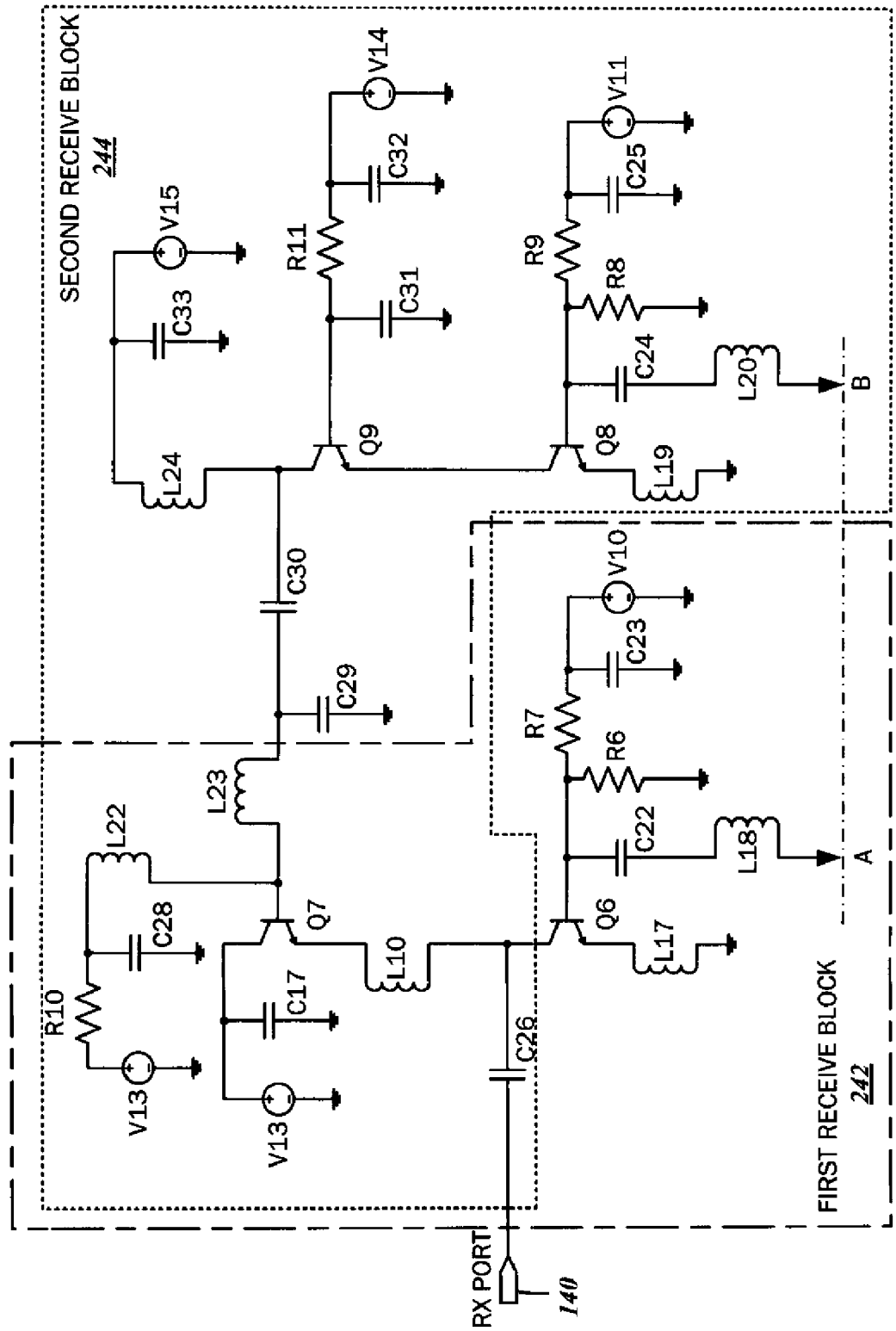
Figure 5C:
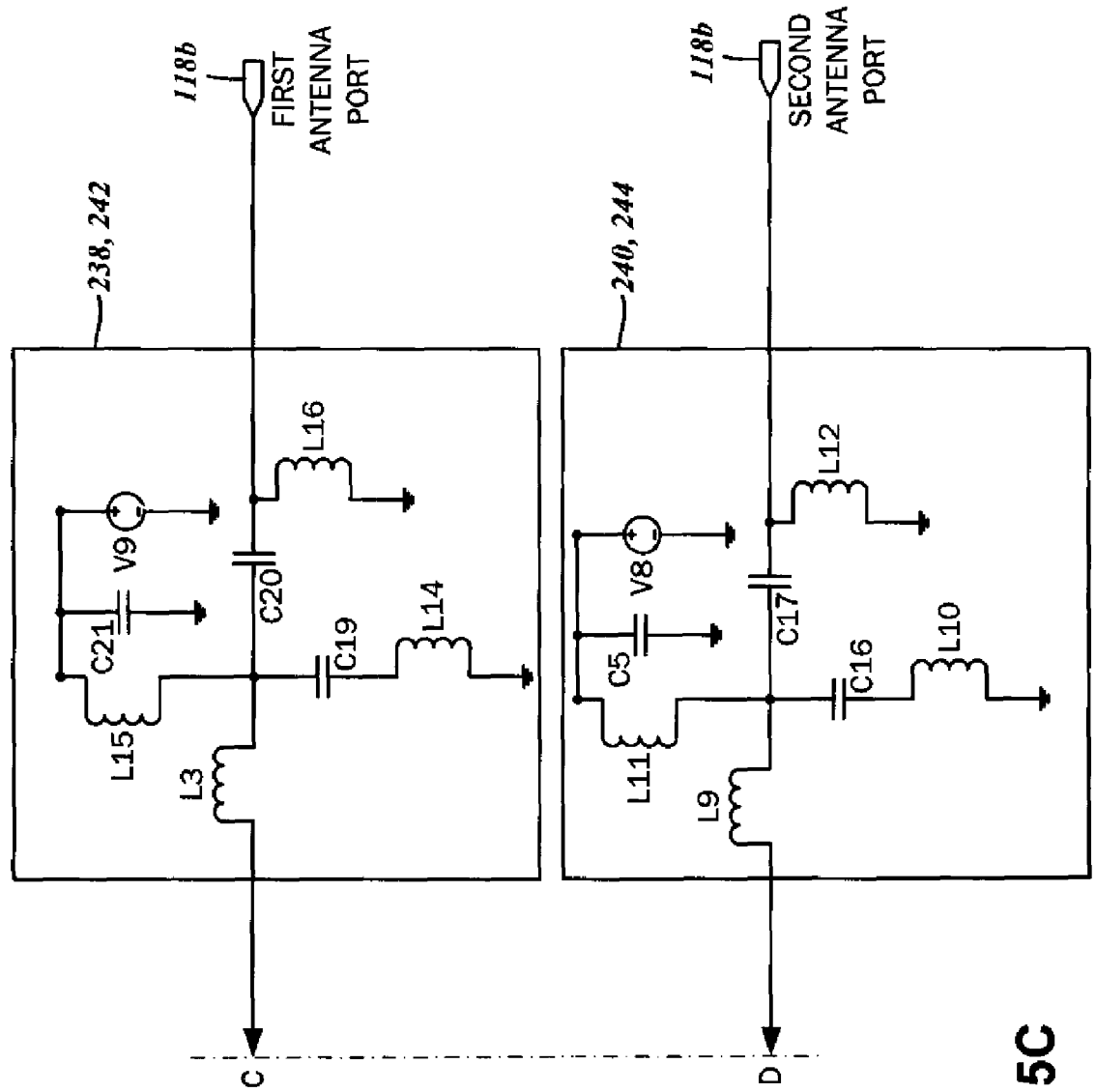

With reference to the schematic diagram of FIGS. 5A-5C, additional details of the third variant 110c of the front end circuit with transmit and receive antenna diversity will be considered. Generally, the front end circuit 110c is comprised of a first transmit block 238, a second transmit block 240, a first receive block 242, and a second receive block 244. The first transmit block 238 primarily corresponds to the first power amplifier 132, and to some extent, the power divider circuit 230 and the first matching and switch network 148. The second transmit block 240 primarily corresponds to the second power amplifier 226, and to some extent, the power divider circuit 230 and the second matching and switch network 228. The first receive block 242 primarily corresponds to the first low noise amplifier 138, and to some extent, the power combiner circuit 150 and the first matching and switch network 148. The second receive block 244 primarily corresponds to the second low noise amplifier 144, and to some extent, the power combiner circuit 150 and the second matching and switch network 228. The first and second transmit blocks 238, 240 include the transmit pin or port 134, and the first and second receive blocks 242, 244 include the receive pin or port 140. Further, the first antenna pin or port 118a is associated with the first transmit block 238 and the first receive block 242, while the second antenna pin or port 118b is associated with the second transmit block 240 and the second receive block 244.

It is contemplated that the first transmit block 238 and the second transmit block 240 have similar architectures. In particular, the first transmit block 238 has the shared stage first transistor Q1 with associated input matching circuitry, along with a cascode stage with the second transistor Q2. The second transmit block 240 also has the shared stage first transistor Q1 with associated input matching circuitry, and a different cascode stage with the third transistor Q3. The two cascode stages are understood to essentially be the power divider circuit 230. In addition to splitting the transmit signal from the transmit pin or port 134, this contemplated embodiment further amplifies the transmit signal, thus eliminating the need for higher gain values in subsequent power amplifier stages. The first transmit block 238 further includes the first power amplifier 132 with the transistor Q4, and the second transmit block includes the second power amplifier 226 with the transistor Q5.

The first receive block 242 and the second receive block 244 are understood to have a similar architecture as the first receive block 202 and second receive block 204 of the third variation 110c. In this regard, the specific optimizations contemplated therefore are understood to be applicable here, as well. The first receive block 242 includes the transistor Q6, in addition to associated matching circuitry, and corresponds to the first low noise amplifier 138. The second receive block 244 includes the transistor Q8 tied to the cascode transistor Q9, and with its associated matching circuitry, corresponds to the second low noise amplifier 144. The transistor Q7 is understood to be a DC bias switch when operating with the transistor Q6. Furthermore, as indicated above, the base-emitter junction of the transistor Q7 is understood to be part of the output matching circuitry when operating with the transistors Q8 and Q9, i.e., the second low noise amplifier 144.

It is understood that the various transistors of the third variation 110c of the front end circuit, like the others described above, are selectively activated to perform the role of RF switches during the two transmit modes and two receive modes of operation contemplated. In the first transmit mode, the transistors Q1, Q2, and Q4 are on with the respective voltage sources V1, V2 and V4 being activated, and the transistors Q3, Q5, Q6, Q7, Q8, and Q9 are turned off with the respective voltage sources V5, V7, V10, V11, V13, and V14 being deactivated or set to below the threshold levels. The RF signal applied to the transmit pin or port 134 is amplified by the stages based upon transistors Q1, Q2, and Q4, that is, the power divider 230, the first power amplifier 132, and the first matching and switch network 148, and passed to the first antenna pin or port 118a.

In the second transmit mode, the transistors Q1, Q3, and Q5 are on with the respective voltage sources V1, V5 and V7 being activated, and the transistors Q2, Q4, Q6, Q7, Q8, and Q9 are turned off with the respective voltage sources V2, V4, V10, V11, V13, and V14 being deactivated or set to below the threshold levels. The RF signal applied to the transmit pin or port 134 is amplified by the stages based upon transistors Q1, Q3, and Q5, that is, the power divider 230, the second power amplifier 226, and the second matching and switch network 228, and passed to the second antenna pin or port 118b.

In the first receive mode, the transistors Q6 and Q7 are on with the respective voltage sources V10 and V13 being activated, while the transistors Q1, Q2, Q3, Q4, Q5, Q8 and Q9 are turned off with the respective voltages sources V1, V2, V4, V5, V7, V11, and V14 being deactivated or set to below the threshold levels. The RF signal from the first antenna 114a as applied to the first antenna port 118a is passed to the first low noise amplifier 138, that is, the transistor Q6. The received, amplified signal is passed to the receive pin or port 140. The transistor Q7 is operating as a DC bias switch, as indicated above.

In the second receive mode, the transistors Q8 and Q9 are on with the respective voltage sources V11 and V14 being activated, while the transistors Q1, Q2, Q3, Q4, Q5, Q6, and Q7 are turned off with the respective voltage sources V1, V2, V4, V5, V7, V10, and V13 being deactivated or set to below the threshold levels. The RF signal from the second antenna 114b as applied to the second antenna port 118b is passed to the second low noise amplifier 144, which is the transistor Q8 and the cascode transistor Q9. The signal is passed through the base-emitter junction of the transistor Q7 to the receive pin or port 140, with current drain through the transistors Q6 and Q7 being almost zero. There is a possibility for other combinations of control voltages applied to the transistors Q6 and Q7. Both the transistors Q6 and Q7 may be on, the transistor Q6 may be on while the transistor Q7 may be off, or the transistor Q6 may be off while the transistor Q7 may be on. It is understood that differing linearity levels are provided for the receive signal at the receive pin or port 140 depending upon the combination.

Figure 6:
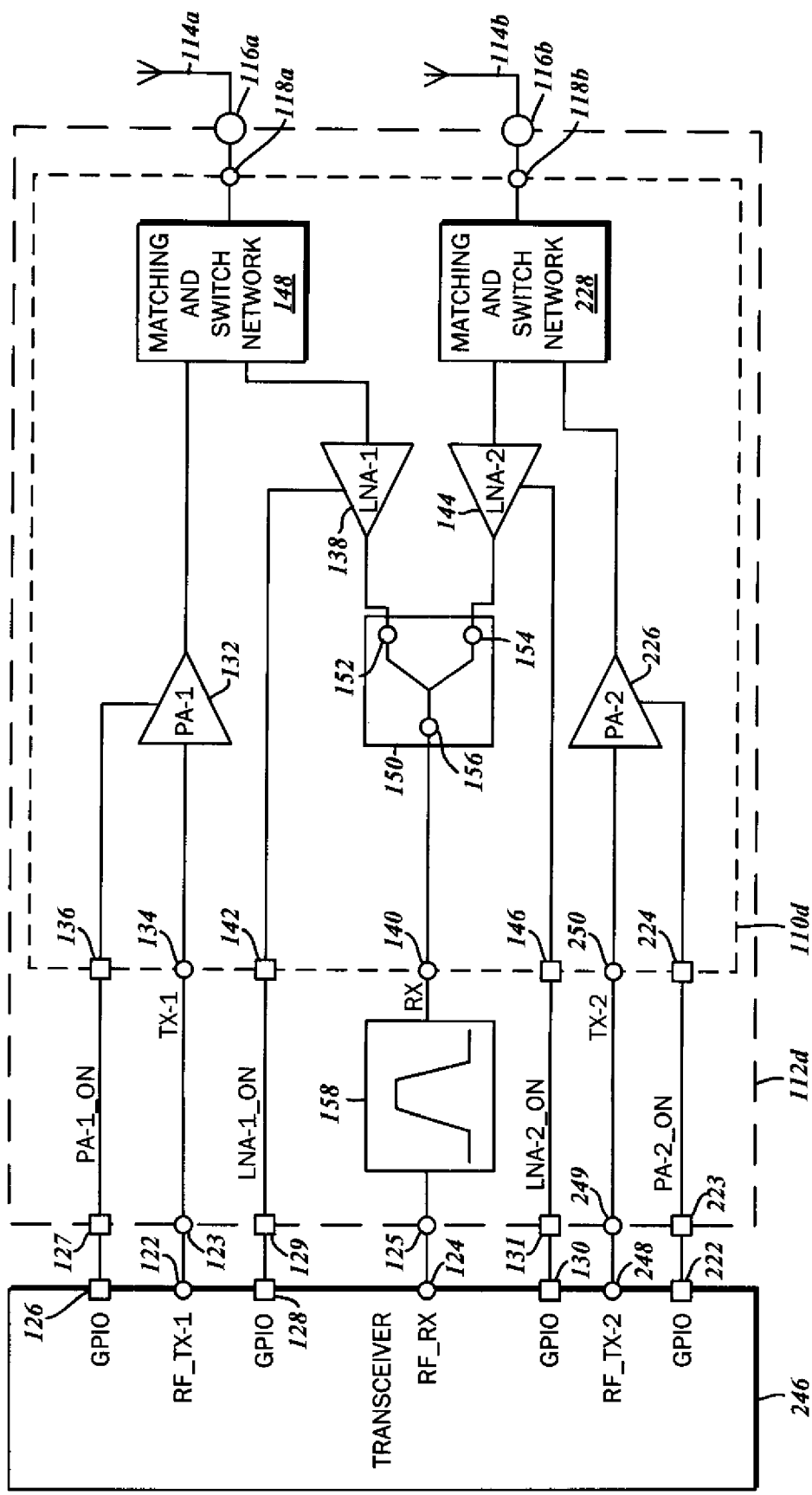
FIG. 6 is a block diagram of yet another embodiment of the front end circuit connected to a transceiver with two separate transmit ports, and a pair of antennas for receive and transmit diversity.

The block diagram of FIG. 6 shows a fourth variation 110d of the front end circuit. It is contemplated that the fourth variation 110d is similar to the third variation 110c that implements both transmit antenna diversity and receive antenna diversity. As described above, that variation includes the first power amplifier 132, the second power amplifier 226, the first low noise amplifier 138, and the second low noise amplifier 144. Like the third variation 110c, in the fourth variation 110d, the output from the first power amplifier 132 and the input to the first low noise amplifier 138 are connected to the first matching and switch network 148, and the two are selectively connected to the first antenna port 118a and subsequently the first antenna 114a. Furthermore, the output from the second power amplifier 226 and the input to the second low noise amplifier 144 are connected to the second matching and switch network 228, with the two being selectively connected to the second antenna port 118b and the second antenna 114b. The output from the first low noise amplifier 138 and the output from the second low noise amplifier 144 are connected to the power combiner circuit 150, which is connected to the receive pin 140.

From the receive pin 140, the amplified signal may be passed to the receive port 124 on another alternative transceiver 246, which varies from the transceiver 120 and transceiver 121 noted above for reasons that will be explained further. Again, the front end module 112d may include the band pass filter 158 connected to the receive pin or port 140 of the front end circuit 110d.

Unlike the transceiver 121, however, the alternative transceiver 246 includes two separate transmit ports: a first transmit port 122, and a second transmit port 248. The first transmit port 122 is connectible to the first transmit port 123 of the front end module 112d, which in turn is connected to the first transmit pin or port 134 of the front end circuit 110d. The second transmit port 248 is connectible to the second transmit port 249 of the front end module 112d, which in turn is connected to the second transmit pin or port 225 of the front end circuit 110d. The first power amplifier 132 is controlled by a first transmit control line associated with the first transmit control line pin 136, and the first low noise amplifier 138 is controlled by a first receive control line associated with the first transmit control line pin 142. Similarly, the second power amplifier 226 is controlled by a second transmit control line associated with a second transmit control line pin 224, and the second low noise amplifier 144 is controlled by a second receive control line associated with the second receive control line pin 146.

With this configuration, the first power amplifier 132, along with the first low noise amplifier 138 and the second low noise amplifier 144, can operate on the same operational frequency while providing antenna diversity. Additionally, the second power amplifier 226 may operate on a different operational frequency, and may even be from another system with a different modulation technique. These may include a low cost control signal, a beacon signal, an emergency signal, a clock signal, a timing signal, and so forth. For proper operation, during the burst transmission amplified by the second power amplifier 226, the second low noise amplifier 144 is deactivated. At the same time however, either the first power amplifier 132 may be on and be transmitting a signal via the first antenna 114a, or receiving a signal from the same to be amplified by the first low noise amplifier 138.

Based upon the several exemplary configurations and embodiments of the front end circuit 110 disclosed herein, and given the basic components of the power amplifiers, low noise amplifiers, matching and switch networks, power dividers, and power combiners it will be appreciated that several other configurations that are different combinations thereof are also possible. The specific configurations described are by way of example only and not of limitation.

Further, the particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention with more particularity than is necessary for the fundamental understanding of the present invention, the description taken with the drawings making apparent to those skilled in the art how the several forms of the present invention may be embodied in practice.

What is claimed is:

1. A front end circuit for selectively coupling a first antenna and a second antenna to a transmit chain and a receive chain of a radio frequency (RF) transceiver, the front end circuit comprising:
   a first power amplifier having an input connectible to the transmit chain of the RF transceiver, and an output;
   a second power amplifier having an output and an input connectible to the transmit chain of the RF transceiver;
   a first low noise amplifier having an output connectible to the receive chain of the RF transceiver, and an input;
   a second low noise amplifier having an input connectible to the second antenna and an output connectible to the receive chain of the RF transceiver;
   a first matching and switch network connected to the first antenna, the output of the first power amplifier, and the input of the first low noise amplifier, transmit signals from the first power amplifier and receive signals from the first antenna being selectively passed to the respective one of the first antenna and the first low noise amplifier thereby based upon an exclusive activation of the first power amplifier and the first low noise amplifier; and
   a second matching and switch network connected to the second antenna, the output of the second power amplifier, and the input of the second low noise amplifier, transmit signals from the second power amplifier and receive signals from the second antenna being selectively passed to the respective one of the second antenna and the second low noise amplifier thereby based upon an exclusive activation of the second power amplifier and the second low noise amplifier.

2. The front end circuit of claim 1, further comprising: a power combiner having a first port connected to the output of the first low noise amplifier, a second port connected to the output of the second low noise amplifier, and an third port connectible to the receive chain of the RF transceiver.

3. The front end circuit of claim 2, wherein:
   the first low noise amplifier and the second low noise amplifier are simultaneously activatable; and
   the receive signals from the first antenna and the receive signals from the second antenna are combined for the receive chain of the RF transceiver by the power combiner.

4. The front end circuit of claim 1, further comprising: a bandpass filter having a first port connected to the first low noise amplifier and the second low noise amplifier, and a second port connectible to the receive chain of the transceiver.

5. The front end circuit of claim 1, wherein:
   the first power amplifier includes a power amplifier transistor;
   the first low noise amplifier includes a first low noise amplifier transistor; and
   a resistive component of an input impedance of the activated first low noise amplifier transistor is substantially equivalent to a resistive component of an output impedance required for the activated power amplifier transistor.

6. The front end circuit of claim 5, wherein:
the first matching and switch network includes a first network segment and a second network segment;
the first power amplifier is impedance matched to the first antenna with the first network segment; and
the first low noise amplifier is impedance matched to the first antenna with a combination of the first network segment and the second network segment.

7. The front end circuit of claim 6, wherein a junction between the first power amplifier and the first network segment has a resistive component of an impedance less than or equal to a transistor load resistance corresponding to a pre-determined 1 decibel compression point at a defined bias voltage in an operating frequency band.

8. The front end circuit of claim 6, wherein components of the second network segment correspond to a substantially minimized noise figure between the first antenna and the output of the first low noise amplifier.

9. The front end circuit of claim 6, wherein components of the second network segment correspond to a substantially minimized voltage swing at a base of the first low noise amplifier transistor.

10. The front end circuit of claim 6, wherein an input return loss of the first network segment and the second network segment is less than −10 decibels.

11. The front end circuit of claim 6, wherein the second network segment has a resonance frequency offset from an operating frequency of the front end circuit.

12. The front end circuit of claim 1, wherein the first power amplifier, the first low noise amplifier, the second low noise amplifier, and the first matching and switch network are fabricated on a single die of silicon substrate.

13. The front end circuit of claim 1, wherein the first power amplifier, the first low noise amplifier, the second low noise amplifier, and the first matching and switch network are fabricated on a single die of gallium arsenide (GaAs) substrate.

14. The front end circuit of claim 1, wherein the first power amplifier, the first low noise amplifier, and the second low noise amplifier have transistor structures selected from the group consisting of: bipolar junction, hetero-junction bipolar, metal semiconductor field effect, metal oxide semiconductor field effect, and high electron mobility.

15. The front end circuit of claim 1, further comprising:
a power splitter having a first port connected to the input of the first power amplifier, a second port connected to the input of the second power amplifier, and a third port connectible to the transmit chain of the RF transceiver.

16. The front end circuit of claim 1, wherein the transmit chain includes a primary transmit line connectible to the first power amplifier and a secondary transmit line connectible to the second power amplifier.

17. The front end circuit of claim 1, wherein the signals from the transmit channel have an operational frequency different from the signals passed to the receive channel.

18. An RF front end circuit for coupling a first antenna and a second antenna to a transceiver with receive channel and a transmit channel, the front end circuit comprising:
a plurality of selectively activatable circuit elements including a power amplifier and low noise amplifiers, the circuit elements together having:
a transmit mode in which signals from the transmit channel are amplified by the power amplifier for the transmission by the first antenna;
a first receive mode in which signals from the first antenna are amplified by a one of the low noise amplifiers for passing to the receive channel;
a second receive mode in which signals from the second antenna are amplified by a different one of the low noise amplifiers for passing to the receive channel; and
a third receive mode in which signals from the first and second antenna are amplified simultaneously by the respective low noise amplifiers for passing to the receive channel;
wherein the plurality of circuit elements are fabricated on a single semiconductor die and wherein the circuit elements together have a hybrid mode in which signals from the transmit channel are amplified by the power amplifier for transmission by the first antenna and in which signals from the second antenna are amplified by the different one of the low noise amplifiers for passing to the receive channel.

19. The front end circuit of claim 18, wherein:
the plurality of selectively activatable circuit elements include a second power amplifier, the circuit elements together having:
a second transmit mode in which signals from the transmit channel are amplified by the second power amplifier for the transmission by the second antenna.

20. The front end circuit of claim 18, wherein the transmit mode is exclusive of the first, second and third receive modes.

21. The front end circuit of claim 18, wherein the first receive mode is exclusive of the second receive mode.

22. The front end circuit of claim 18, wherein the third receive mode is exclusive of the first and second receive modes.

23. An RF transceiver front end circuit for coupling a transceiver to a plurality of antennas, comprising:
first and second antenna ports connectible to a respective one of a first of the plurality of antennas and a second of the plurality of antennas;
a transmit port;
a receive port;
a first power amplifier including a first power amplifier transistor having a base coupled to the transmit port, a collector, and an emitter;
a first power amplifier control circuit with a first adjustable voltage source coupled to the base of the first power amplifier transistor, the first power amplifier control circuit activating and setting a bias point of the first power amplifier transistor;
a first low noise amplifier including a first low noise amplifier transistor having a base, a collector coupled to the receive port, and an emitter;
a first low noise amplifier control circuit with a second adjustable voltage source coupled to the base of the first low noise amplifier transistor, the first low noise amplifier control circuit activating and setting a bias point of the first low noise amplifier transistor;
a first antenna matching circuit including a first power amplifier output matching segment coupled to the collector of the first power amplifier transistor and the first antenna port, and a first low noise amplifier input matching segment coupled to the base of the first low noise amplifier transistor and the first antenna port, the first power amplifier output matching segment having shared components with the first low noise amplifier segment;
a second low noise amplifier including a second low noise amplifier transistor having a base, a collector coupled to the receive port, and an emitter;
a second low noise amplifier control circuit with a third adjustable voltage source coupled to the base of the second low noise amplifier transistor, the second low noise amplifier control circuit activating and setting a bias point of the second low noise amplifier transistor; and a second antenna input matching circuit coupling the second antenna port to the base of the second low noise amplifier transistor.

24. The front end circuit of claim 23, further comprising:
a power combiner including a first port connected to the transmit port, a second port connected to the collector of the first low noise amplifier transistor, and a third port connected to the collector of the second low noise amplifier transistor.

25. The front end circuit of claim 23, further comprising:
a transceiver output matching circuit connected to the transmit port, the first low noise amplifier, and a second low noise amplifier.

26. The front end circuit of claim 23, wherein the transistors have a structure selected from the group consisting of: bipolar junction and hetero junction bipolar.

27. The front end circuit of claim 23, wherein:
the transistors have a structure selected from the group consisting of: metal semiconductor field effect, metal oxide semiconductor field effect, and high electron mobility;
the respective one of the collectors of the transistors corresponding to drains;
the respective one of the emitters of the transistors corresponding to sources; and
the respective one of the bases of the transistors corresponding to gates.

28. The front end circuit of claim 23, wherein the active switching circuit is fabricated on a single semiconductor die.

29. An RF transceiver front end circuit for coupling a transceiver to a plurality of antennas, comprising:
first and second antenna ports connectible to a respective one of a first of the plurality of antennas and a second of the plurality of antennas;
a transmit port;
a receive port;
a shared power amplifier stage including a first power amplifier transistor with a base connected to the transmit port, a collector, and an emitter;
a first independent power amplifier stage including a first independent power amplifier transistor with a base, a collector, and an emitter coupled to the collector of the first power amplifier transistor;
a second independent power amplifier stage including a second independent power amplifier transistor with a base, a collector, and an emitter coupled to the collector of the first power amplifier transistor, a first low noise amplifier including a first low noise amplifier transistor having a base, a collector coupled to the receive port, and an emitter;
a first antenna matching circuit including a first power amplifier output matching segment coupled to the collector of the first independent power amplifier transistor and the first antenna port, arid a first low noise amplifier input matching segment coupled to the base of the first low noise amplifier transistor and the first antenna port, the first power amplifier output matching segment having shared components with the first low noise amplifier segment;
a second low noise amplifier including a second low noise amplifier transistor having a base, a collector coupled to the receive port, and an emitter; and
a second antenna matching circuit including a second power amplifier output matching segment coupled to the collector of the second independent power amplifier transistor and the first antenna port, and a second low noise amplifier input matching segment coupled to the base of the second low noise amplifier transistor and the second antenna port, the second power amplifier output matching segment having shared components with the second low noise amplifier segment.

30. The front end circuit of claim 29, further comprising:
a transceiver output matching circuit connected to the transmit port, the first low noise amplifier, and a second low noise amplifier.

31. The front end circuit of claim 29, wherein each of the first and second power amplifiers and the first and second low noise amplifiers includes a control circuit with an adjustable voltage source coupled to the bases of the respective transistors, the control circuit activating and setting a bias point of the respective transistors.

* * * * *